(12) United States Patent
Fukushima et al.

(10) Patent No.: US 7,098,680 B2
(45) Date of Patent: Aug. 29, 2006

(54) CONNECTION UNIT, A BOARD FOR MOUNTING A DEVICE UNDER TEST, A PROBE CARD AND A DEVICE INTERFACING PART

(75) Inventors: Kentaro Fukushima, Tokyo (JP); Masashi Hoshino, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/800,189

(22) Filed: Mar. 12, 2004

(65) Prior Publication Data

US 2004/0174180 A1  Sep. 9, 2004

Related U.S. Application Data

(63) Continuation of application No. PCT/JP03/13595, filed on Oct. 24, 2003.

(51) Int. Cl.
*G01R 31/02* (2006.01)
(52) U.S. Cl. ..................................... 324/763
(58) Field of Classification Search ............... 324/765, 324/760, 763, 754, 761, 158.1; 439/66–72; 174/168
See application file for complete search history.

(56) References Cited

U.S. PATENT DOCUMENTS 5,764,071 A * 6/1998 Chan et al. ................. 324/754
6,320,398 B1 * 11/2001 Ito et al. ..................... 324/755
6,462,570 B1 * 10/2002 Price et al. .................. 324/754
6,522,156 B1 * 2/2003 Tustaniwskyj et al. ..... 324/754
6,891,384 B1 * 5/2005 Mardi et al. ................ 324/754

FOREIGN PATENT DOCUMENTS

| JP | 64-053429 | 3/1989 |
|---|---|---|
| JP | 11-064442 | 3/1999 |
| JP | 2000-081461 | 3/2000 |

OTHER PUBLICATIONS

"Build-Up Multilayer Printed Wiring Board Technology" p. 7-8, Kiyoshi Takagi, Nikkam-Kogyo, Inc.

* cited by examiner

*Primary Examiner*—Paresh Patel
*Assistant Examiner*—Tung X. Nguyen
(74) *Attorney, Agent, or Firm*—Muramatsu & Associates

(57) ABSTRACT

A connection unit for electrically connecting a DUT mounting board, on which an IC socket is mounted, with a testing apparatus for testing an electronic device inserted into the IC socket, the connection unit has a holding substrate provided to face the DUT mounting board and a connection-unit-side connector, which is provided on the holding substrate to be able to change a position of the connection-unit-side connector on the holding substrate, for being connected to a performance-board-side connector included in the DUT mounting board.

22 Claims, 15 Drawing Sheets

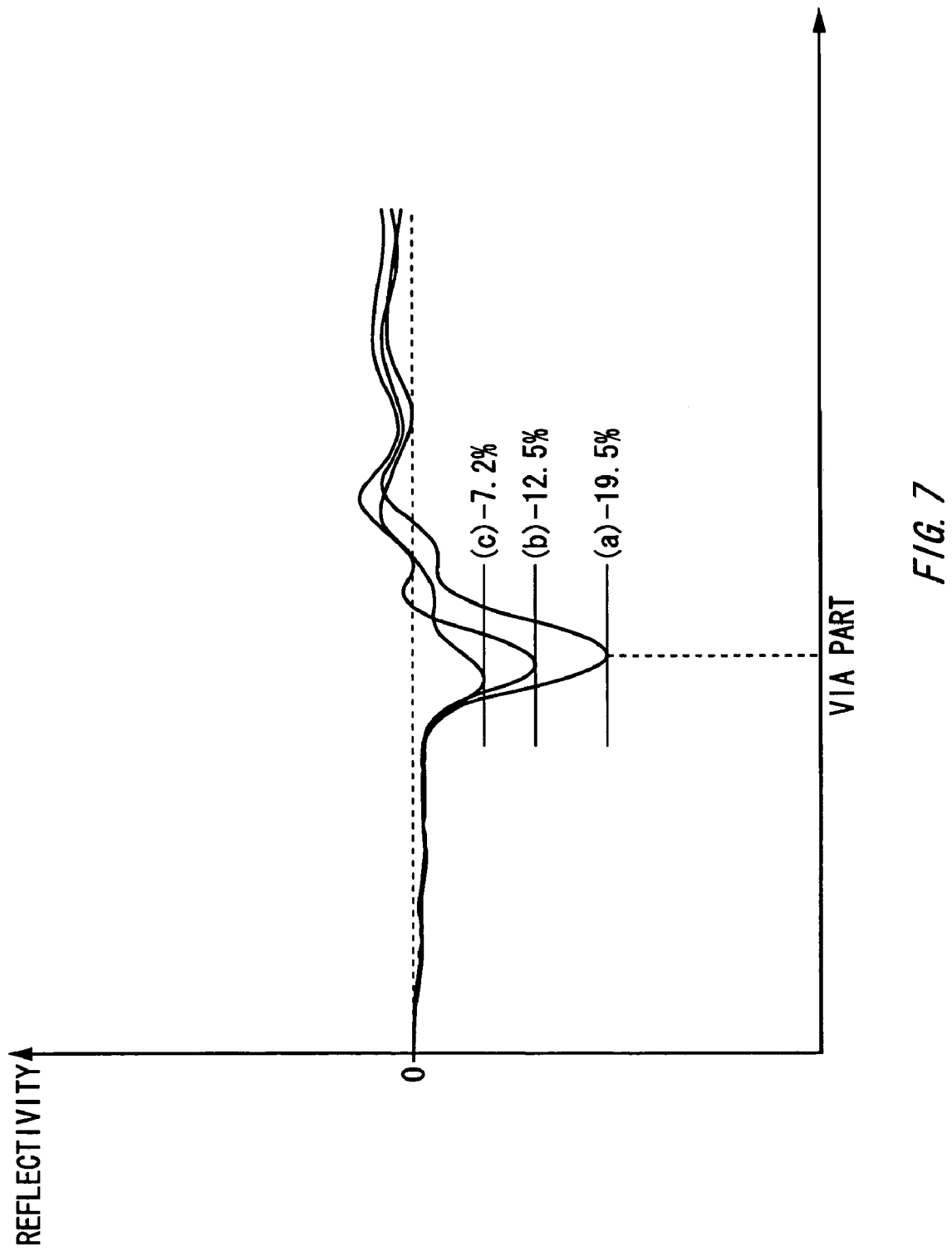

CONNECTION UNIT, A BOARD FOR MOUNTING A DEVICE UNDER TEST, A PROBE CARD AND A DEVICE INTERFACING PART

The present application is a continuation application of PCT/JP03/13595 filed on Oct. 24, 2003, which claims priority from Japanese Patent Applications Nos. 2002-317287 filed on Oct. 31, 2002 and 2002-338560 filed on Nov. 21, 2002, the entire contents of which are incorporated herein by reference.

BACKGROUND OF THE INVENTION

1. Field of the Invention

The present invention relates to a testing apparatus. More particularly, the present invention relates to structures of a board, generally called a performance board, a probe card or a socket board for mounting a device under test ("DUT") and a connection unit for connecting the DUT mounting board and the body of the testing apparatus.

2. Description of the Related Art

FIG. 14 shows a schematic structure of a conventional IC testing apparatus, which is described first hereinafter.

In large, the IC testing apparatus includes a main frame 1, a test head 2 and a DUT interface part 3. The main frame and the test head 2 are connected by a cable 4, and the DUT interface part 3 is mounted on and connected to the test head 2.

In this example, the DUT interface part 3 includes, for example, a substrate 11, a motherboard 10 provided with a plurality (e.g. thousands) of cables 12 ("a motherboard unit"), a DUT mounting board 20 generally called a performance board, and an IC socket 320. The substrate 11 is provided with a connector (not shown) for connecting to the test head 2 on its lower surface.

The lower end of the cable 12 is soldered on or connected via the connector to the substrate 11, and the upper end of the cable 12 is connected to the DUT mounting board 20 via a connector (not shown), etc. In this example, one IC socket 320 is mounted on the DUT mounting board 20. As shown in FIG. 14, there is shown DUT (IC under test) 40 mounted on the IC socket 320. Further, there is also shown a cover 13 which covers the cable 12.

FIG. 15 shows a conventional structure of DUT mounting board 20 according to the above structured IC testing apparatus and a schematic connection relationship between the DUT 40 and a connector 15 (on the upper end of the cable 12) in regard to the DUT mounting board 20, where the IC socket 320 is omitted.

The DUT mounting board 20 has a structure of a multilayer printed circuit board, on the upper surface and the lower surface of which electrode pads 21 and 22 are formed for connecting to the DUT 40 and the connector 15, respectively.

Through holes 23 are formed on the corresponding electrode pads 21 and 22 on the upper and lower surfaces of the board 20. The through holes 23 are connected with internal layer wiring patterns 24. In other words, the conventional DUT mounting board has a structure of a multilayer printed circuit board using through holes 23 for connecting the electrode pads 21 and 22 with the internal layer wiring patterns 24. See, for example, in an article of "Build-Up Multilayer Printed Wiring Board Technology", Page 7 to 8, written by Kiyoshi Takagi, published by Nikkan-Kogyo Newspaper, Inc., Jun. 20, 2000. Arrows in FIG. 14 show flows of electrical signals.

However, recently, high speed testing is required for the IC testing apparatus, and high speed, e.g. 4 Gbps, signals are used for the high speed testing of the DUT.

As the signal speed becomes faster, design of surroundings of the through holes 23 of the conventional DUT mounting board 20 of the above described structure shown in FIG. 15 affects reflections and band blockings.

In other words, as designated by dashed line in FIG. 15, since a stub part 25 (hereinafter, parts unnecessary for transmission lines are called stub parts) for the through hole 23 is large (or long), capacitance of this stub part 25 becomes a problem of producing waveform distortion and capacitive reflection, which cause deterioration of signal quality (or waveform quality). Therefore, the conventional DUT mounting board 20 has a problem of not coping with high speed signals.

Further, in case of conventional testing of electronic devices like semiconductor devices, there have been used a testing apparatus for generating test signals, a performance board for mounting an electronic device and a connection unit for electrically connecting the testing apparatus with the performance board. The performance board and the connection unit respectively have connectors engaging each other. The connector of the connection unit receives test signals from the testing apparatus and provides them to the electronic device via the connector of the performance board.

The connectors of the connection unit and the performance board are respectively fixed on predetermined locations of the connection unit and the performance board, and electrically connect the testing apparatus with the performance board by engaging corresponding connectors as disclosed, for example in Japanese Patent Application Laid-Open No. 2000-81461. For example, respective connectors are provided on neighborhoods of the outermost circumferences of the connection unit and the performance board.

However, since the connector of the connection unit is fixed, it is difficult to connect the connection unit with the performance board where the location of the connector is different. Thus, it is required to prepare each connection unit which has each connector arrangement corresponding to each performance board of different connector location.

For example, in case a high frequency signal is applied to the electronic device, it is required to arrange the connector of the performance board to be near the electronic device in order to shorten the length of the transmission line from the connector of the performance board to the electronic device. In this case, it is also required to arrange the connector of the connection unit on a location corresponding to the location of the connector of the performance board. But, since the connector of the conventional connection unit is fixed, it is required to prepare a connection unit for high frequency signals.

SUMMARY OF THE INVENTION

Therefore, it is an object of the present invention to provide a connection unit, a DUT mounting board, a probe card and a device interface part, which are capable of overcoming the above drawbacks accompanied by the conventional art. The above and other objects can be achieved by combinations described in the independent claims. The dependent claims define further advantageous and exemplary combinations of the present invention.

According to the first aspect of the present invention, a connection unit for electrically connecting a DUT mounting board, on which an IC socket is mounted, with a testing apparatus for testing an electronic device inserted into the IC socket, the connection unit comprises a holding substrate provided to face the DUT mounting board and a connection-unit-side connector, which is provided on the holding substrate to be able to change a position of the connection-unit-side connector on the holding substrate, for being connected to a performance-board-side connector which the DUT mounting board comprises.

The holding substrate may comprise, in case a position of the performance-board-side connector varies according to kinds of the DUT mounting board, a means for moving the connection-unit-side connector to a position corresponding to the varied position of the performance-board-side connector.

The connection-unit-side connector may be detachable from the holding substrate, so that the connection-unit-side connector detached from the holding substrate may be re-attached to other holding substrate on which a performance-board-side connector is provided in a different position.

The connection-unit-side connectors may be plural, and distances between the plurality of connection-unit-side connectors can be changed on the holding substrate.

The connection-unit-side connector may be provided in order that the distance can be changed, with regard to the position of the IC socket where the connection unit and the DUT mounting board are connected.

The connection unit may further comprise a connection cable, of which an end is fixed to the connection-unit-side connector, for electrically connecting the connection-unit-side connector and the testing apparatus, wherein the holding substrate has a penetrating hole, of which a diameter admits the connection-unit-side connector, at a position to hold the connection-unit-side connector.

The connection unit may further comprise a connection cable, of which an end is fixed to the connection-unit-side connector, for electrically connecting the connection-unit-side connector and the testing apparatus, wherein the holding substrate has a penetrating hole, through which the connection cable passes, between a plurality of positions to be able to change the connection-unit-side connector.

The holding substrate holds the connection-unit-side connector to be able to change the position in either a radial direction or an axial direction, taking a position of the IC socket, where the connection unit and the DUT mounting board are connected, as a center.

The cross sections of the IC socket and the connection-unit-side connector may be rectangular respectively at a surface substantially parallel to the holding substrate, and the holding substrate may hold the connection-unit-side connector so that a longer side of the cross section of the connection-unit-side connector faces a nearest side of the cross section of the IC socket, in case the connection-unit-side connector is positioned most closely to the IC socket, with regard to a direction of diameter.

The holding substrate may comprise a plurality of connector positioning members, respectively provided at predetermined positions on the holding substrate, for designating positions where the connection-unit-side connector may be changed.

The connection-unit-side connector may comprise either groove or protrusion, one of which is inserted into one another, each of the plurality of connector positioning members comprises corresponding one of groove or protrusion, and the holding substrate may hold the connection-unit-side connector by engaging the groove or protrusion of the connection-unit-side connector with the groove or protrusion of the connector positioning member.

A plurality of IC sockets may be placed on the DUT mounting board, and the connection unit comprises a plurality of connection-unit-side connectors corresponding to the plurality of the IC sockets, whereby the holding substrate holds each of the plurality of connection-unit-side connectors so that a position of the connection-unit-side connector may be changed.

The connection unit further comprise a small diameter performance board positioning member, provided on the holding substrate, for designating a DUT mounting board of which a diameter is smaller than a predetermined diameter, and a large diameter performance board positioning member, provided at a position farther from the IC socket than a position of the small diameter performance board positioning member on the holding substrate, for designating a DUT mounting board of which a diameter is larger than a predetermined diameter.

According to the second aspect of the present invention, a DUT mounting board for electrically connecting an electronic device and a testing apparatus for testing the electronic device, the DUT mounting board comprises an IC socket for holding the electronic device, a socket substrate for holding the IC socket, a high-frequency signal connector for supplying a test signal from the testing apparatus to the IC socket, and a low-frequency signal connector, provided farther from the IC socket than a position of the high-frequency signal connector, for supplying a test signal of which a frequency is lower than the test signal which the high-frequency signal connector provides from the testing apparatus to the IC socket.

The socket substrate may comprise a single-sided hole for high-frequency which is electrically connected to the high-frequency signal connector and extends from a bottom surface, where the high-frequency signal connector is provided on the socket substrate, to an intermediate layer not reaching a top surface of the socket substrate, and a through hole for low-frequency which is electrically connected to the low-frequency signal connector, is provided at a peripheral portion of the socket substrate with regard to the single-sided hole for high-frequency, and extends penetratingly from a bottom surface, where the low-frequency signal connector is provided on the socket substrate, to a top surface on which the electronic devices are placed.

The socket substrate may further comprise a through hole for high-frequency which is electrically connected to a high-frequency terminal pin of the electronic device and extends penetratingly from the top surface to the bottom surface of the socket substrate, and an single-sided hole for low-frequency which is electrically connected to a low-frequency terminal pin of the electronic device, is provided at a peripheral portion of the socket substrate with regard to the through hole for high-frequency, and extends from the top surface to an intermediate layer not reaching the bottom surface of the socket substrate.

The socket substrate may be a multilayer board in which a plurality of wiring layers is formed, wherein the socket substrate further comprises a low-frequency signal wiring, formed on one of the layers, for electrically connecting the through hole for low-frequency with the single-sided hole for low-frequency, and a high-frequency signal wiring, formed on a layer lower than the layer on which the low-frequency signal wiring is formed, for electrically connecting the single-sided hole for high-frequency with the through hole for high-frequency.

According to third aspect of the present invention, a DUT mounting board for electrically connecting an electronic device and a testing apparatus for testing the electronic device, the DUT mounting board comprises a socket substrate having a plurality of layers on which wirings are formed respectively, and a connector, provided on a bottom surface of the socket substrate, for supplying a test signal from the testing apparatus to the electronic device, wherein the socket substrate comprises a signal wiring, formed on a layer of the socket substrate, for transferring the testing signal to the electronic device, a plurality of upper layer ground (GND) wirings, formed on an upper layer than the signal wiring, for being connected to a ground potential, a plurality of lower layer GND wiring, formed on a lower layer than the signal wiring, for being connected to the ground potential, and an single-sided hole, extending from a bottom surface to a top surface of the socket substrate, for electrically connecting the connector and the signal wiring, whereby a horizontal distance between at least one of the upper layer GND wiring and the single-sided hole is greater than a horizontal distance between at least one of the lower layer GND wiring and the single-sided hole.

A horizontal distance between a first one of the upper layer GND wirings closest to the signal wiring and the single-sided hole may be substantially the same as a horizontal distance between the lower layer GND wiring and the single-sided hole, and is smaller than a horizontal distance between a second one of the upper layer GND wirings and the single-sided hole.

The single-sided hole may extend from a bottom surface of the socket substrate to an intermediate layer not reaching a top surface of the socket substrate.

According fourth aspect of the present invention, a DUT mounting board for electrically connecting an electronic device and a testing apparatus for testing the electronic device, the DUT mounting board comprises a socket substrate having a plurality of layers on which wirings are formed respectively, and a connector, provided on a bottom surface of the socket substrate, for supplying a test signal form the testing apparatus to the electronic device, wherein the socket substrate comprises a signal wiring, formed on a layer of the socket substrate, for transferring the testing signal to the electronic device, an single-sided hole, extending from a bottom surface of the socket substrate to an intermediate layer not reaching a top surface of the socket substrate, for electrically connecting the connector and the signal wiring, and a plurality of GND wirings for being connected to a ground potential, which are formed at one of the layers excluding the signal wiring except a place where the single-sided hole is formed, in case the single-sided hole extends to the top surface of the socket substrate.

According fifth aspect of the present invention, a probe card for electrically connecting an electronic device with a testing apparatus for testing the electronic device, the probe card comprises a probe pin for being electrically connected to a terminal of the electronic device, a probe board for holding the probe pin, a high-frequency signal connector for supplying a test signal from the testing apparatus to the probe pin, and a low-frequency signal connector, provided farther from the probe pin than a position of the high-frequency signal connector, for supplying a test signal, of which a frequency is lower than the test signal supplied to the probe pin by the high-frequency signal connector.

According sixth aspect of the present invention, a DUT mounting board for interfacing a test signal used for testing DUT in an IC testing apparatus, comprises a multilayer printed circuit board, in which a first one of both ends of an internal layer wiring pattern is connected to a through hole, and a second one of the both ends of the internal layer wiring pattern is connected to an SVH (Surface Buried Via Hole), and upper and lower ground layers, between which the internal layer wiring pattern is interposed, wherein the ground layers are distanced from a stub part of the SVH in order to reduce deterioration of transfer properties according to the stub part, whereby the SVH, internal layer wiring pattern and through hole form wiring connection between top and bottom surfaces of the printed circuit board.

The DUT mounting board may comprise a plural layer printed circuit board comprising an internal layer wiring pattern and a ground layer, wherein at least two the plural layer printed circuit boards are bonded, and through holes, connected to one of the internal layer wiring patterns, are formed to produce a multilayer printed circuit board, and the SVH, which connects an end of the internal layer wiring pattern, is formed out of the through holes, so that predetermined characteristic impedance is formed according to the width of the internal layer wiring pattern and the distance between the upper and the lower ground layers.

According seventh aspect of the present invention, a device interfacing part of IC testing apparatus for interfacing electrical signals flowing between a test head and a DUT, comprising a DUT mounting board for interfacing electrical signals used for testing DUT, the DUT mounting board comprises a multilayer printed circuit board, in which a first one of both ends of an internal layer wiring pattern is connected to a through hole, and a second one of the both ends of the internal layer wiring pattern is connected to an SVH, and upper and lower ground layers, between which the internal layer wiring pattern is interposed, and wherein the ground layers are distanced from a stub part of the SVH (Surface Buried Via Hole) in order to reduce deterioration of the transmission characteristic according to the stub part, whereby the SVH, internal layer wiring pattern, and through hole form wiring connection between top and bottom surfaces of the printed circuit board.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 7 shows an example of the result of measuring reflection components that occur in regard to the example shown in FIG. 6 respectively.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
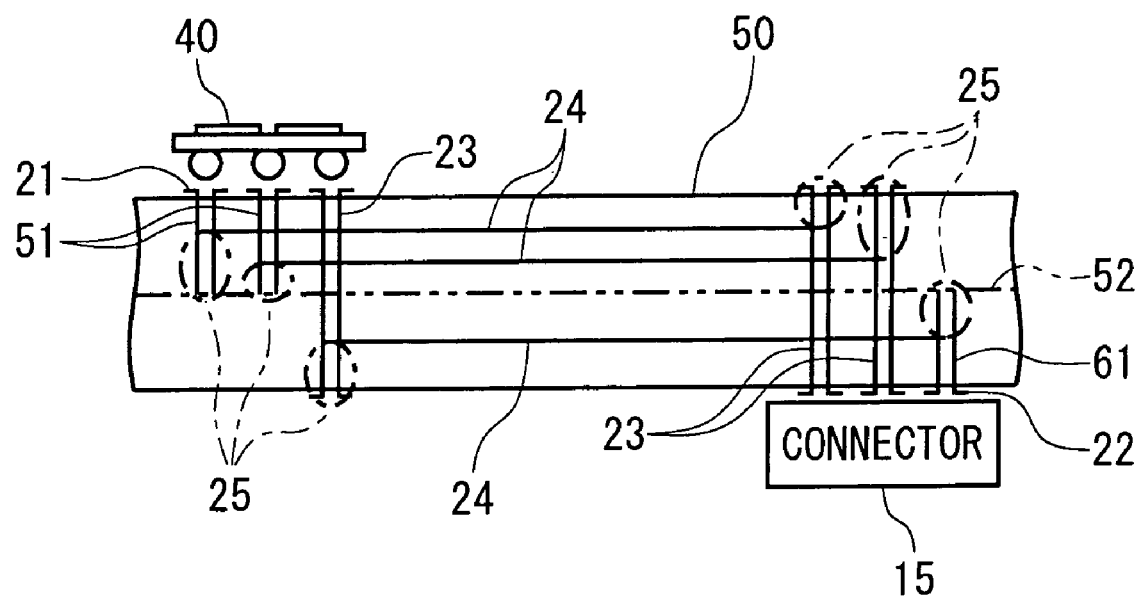
FIG. 1 shows a first embodiment of a DUT mounting board according to the present invention.
Figure 15:
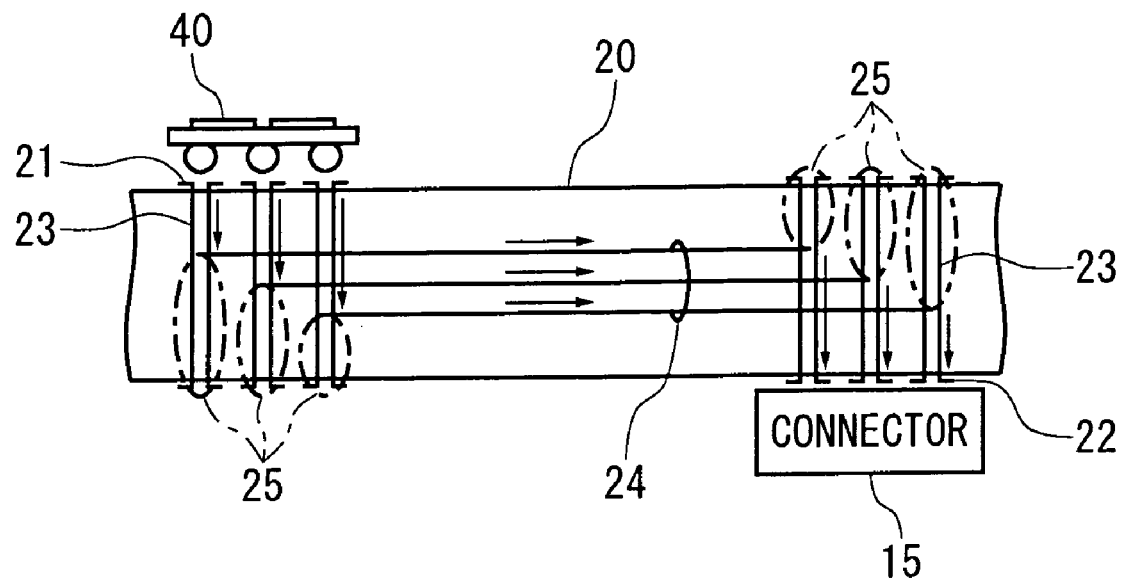
FIG. 15 shows a conventional structure of DUT mounting board.

FIG. 1 schematically shows an embodiment of a DUT mounting board according to the present invention, and the parts corresponding to those in FIG. 15 are given the same symbols and the detailed description will be omitted.

The DUT mounting board 50 having a multilayer printed wiring substrate structure as an example is connected with electrode pads 21 and 22 on its upper and lower surfaces and an internal layer wiring pattern 24, and uses a through hole 23 and a SVH (Surface Buried Via Hole) 51.

At the both ends of each internal layer wiring pattern 24, one of these is connected with the through hole 23 and the other is connected with the SVH 51, and the wiring between the electrode pads 21 and 22 corresponding to the lower surface is configured by the SVH 51, the internal layer wiring pattern 24 and the through hole 23.

FIG. 1 shows the internal layer wiring pattern 24 schematically as three, and the SVH 51 is formed at the electrode pad 21 for connecting the device under test 40 with two of these, the SVH 51 is formed at the electrode pad 22 for connecting the connector 15 with the rest. Which of both ends of the internal layer wiring pattern 24 and the SVH 51 will be provided at is properly decided for example in considering the wiring position of pins of the internal layer wiring pattern 24 or the number of the electrode pads 21 at the connection side of the device under test 40.

According to the DUT mounting board 50 having the configuration above, by adopting the SVH 51 at either of the both ends of the internal layer wiring pattern 24, it is possible to shorten the length of a stub part 25, which is a part using the SVH 51, in comparison to the conventional DUT mounting board 20 described in FIG. 15, and thus it is possible to reduce the capacity of the stub part 25, so the present invention can correspond to the speeding-up of signals.

In addition, in order to configure the SVH 51 at the DUT mounting board 50 shown in FIG. 1, a via hole is first formed only at one wiring substrate, and then two of wiring substrates are bonded together. In FIG. 1, the chain double-dashed lines show the bonding part (bonding surface) 52.

Figure 2:
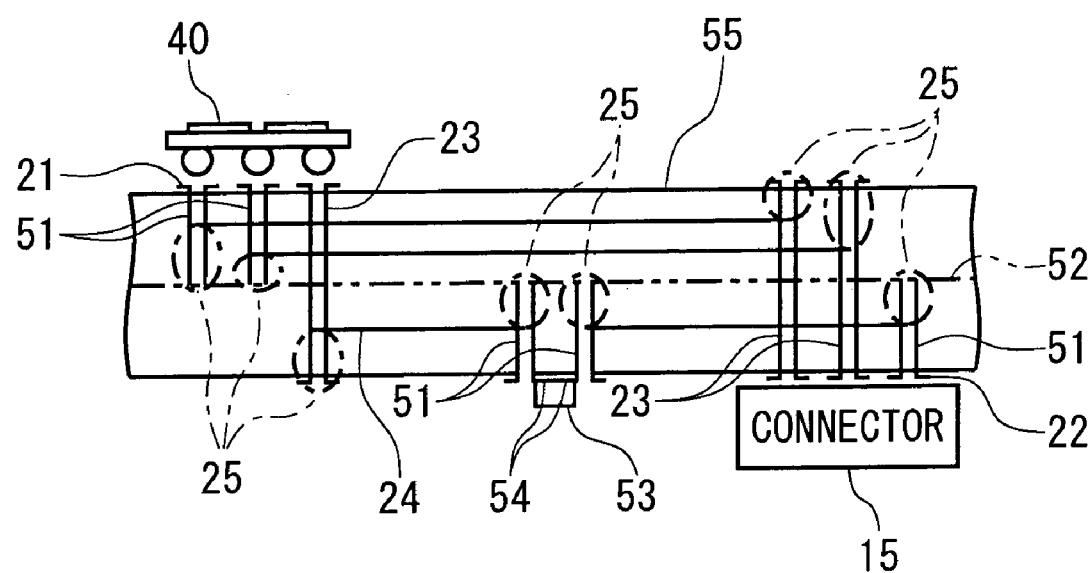
FIG. 2 shows a second embodiment of a DUT mounting board according to the present invention.

FIG. 2 shows another embodiment of the DUT mounting board according to the present invention, wherein for example a resistor needs to be mounted on a part of the internal layer wiring pattern 24, and the SVH 51 is provided on the way of the internal layer wiring pattern 24. In FIG. 2, a numeral 53 shows a device such as a resistor. The device 53 is mounted on a pair of electrode pads 54 in which a pair of the SVH 51 are formed.

The DUT mounting board 55 shown in FIG. 2 is used corresponding to the required specification. In addition, it is possible to manufacture the DUT mounting board 55 in the same manufacturing method as that of the DUT mounting board 50 described above.

Figure 3:
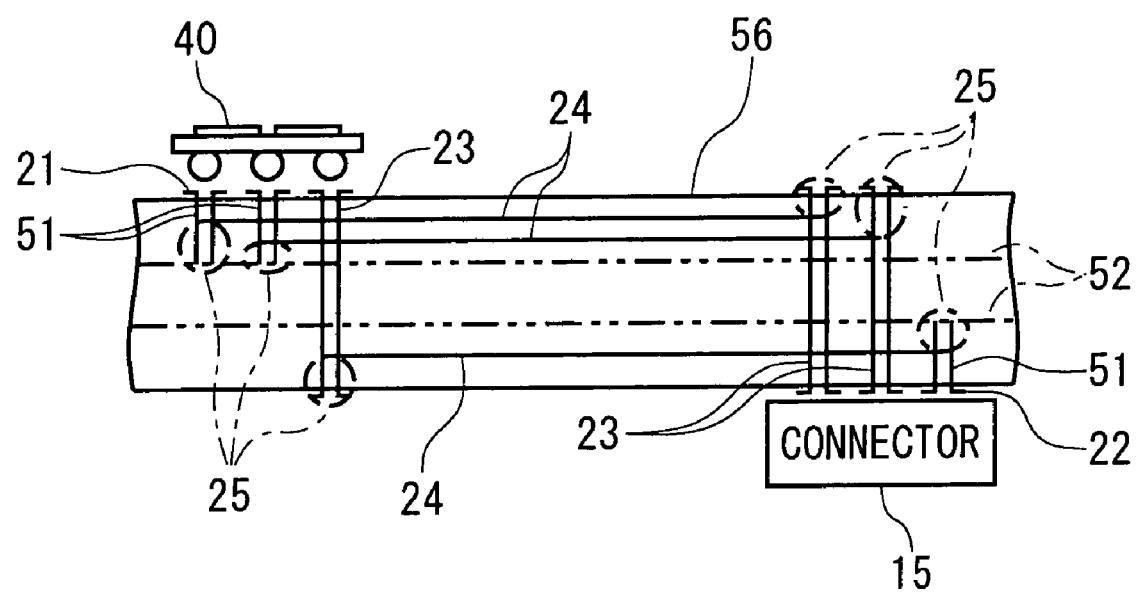
FIG. 3 shows a third embodiment of a DUT mounting board according to the present invention.

FIG. 3 shows a DUT mounting board 56 having a structure in which a third wiring substrate is interposed between two wiring substrates, where the via hole is formed, to configure the SVH 51 and these three wiring substrates are bonded, unlike the structures of the DUT mounting boards 50 and 55 shown in FIG. 1 and FIG. 2, and by adopting this structure it is possible to further reduce the capacity of the stub part 25 in comparison to the DUT mounting board 50 shown in FIG. 1.

Figure 14:
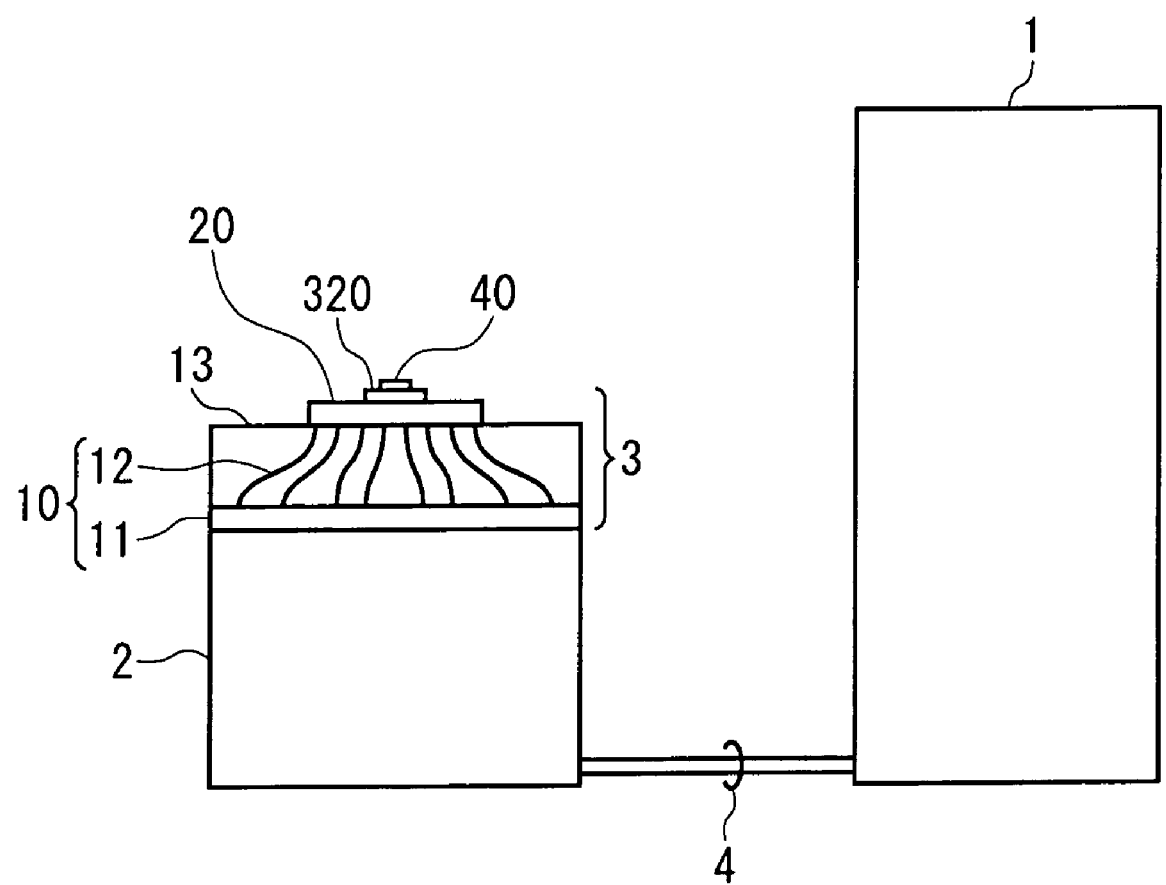
FIG. 14 shows a schematic structure of a conventional IC testing apparatus.

Although each of the DUT mounting boards 50, 55 and 56 described above is called a performance board in regard to the device interface unit 3 of the IC testing apparatus shown in FIG. 14, the structure of the device interface unit 3 is not limited to the structure shown in FIG. 14, and other configuration may be used according to the use and purpose of the IC testing apparatus.

Figure 4A:
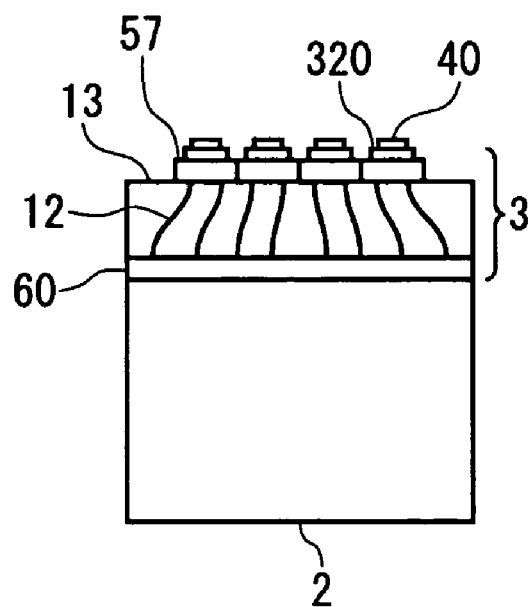
FIGS. 4A and 4B show an example of the configurations of a device interface unit of an IC testing apparatus.
Figure 4B:
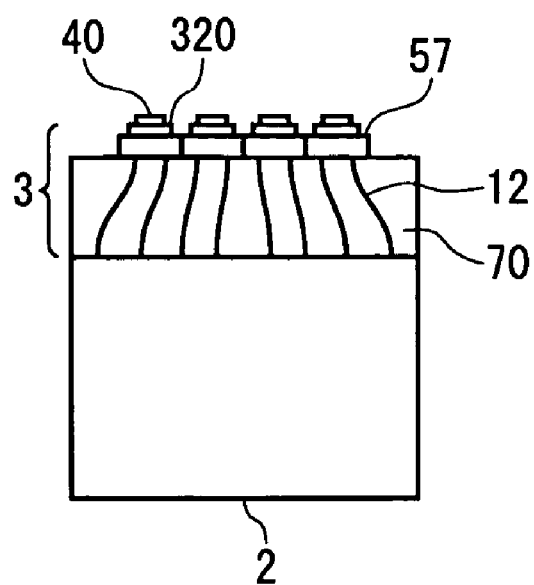

FIGS. 4A and 4B show another example of the configuration of the device interface unit 3 with the test head 2, hereinafter the configuration will be described briefly.

FIGS. 4A and 4B show another example of the configuration of the device interface unit 3 with the test head 2, hereinafter the configuration will be described briefly.

In FIG. 4A, the device interface unit 3 consists of a performance board 60, a plurality of cables 12, which is the same as that in FIG. 14, a plurality of DUT mounting boards 57, generally called a socket board and an IC socket 320.

The performance board 60 has a connector (not shown in the drawing) for the connection with the test head 2 on its lower surface, and it is mounted on the test head 2 by being connected with the test head 2 in the connector connection. In this embodiment, the position of the board called the performance board is different from FIG. 14.

The lower and upper ends of the cables 12 are connected respectively with the performance board 60 and the DUT mounting board 57 by solder, the IC socket 320 is mounted on the DUT mounting board 57. The number of the DUT mounting boards 57 is simplified in FIG. 4A, for example, to be 16 or 32.

Meanwhile, in FIG. 4B the device interface unit 3 consists of a mother board (the mother board unit) 70 by a plurality of cables 12, a plurality of DUT mounting boards 57 called the socket boards like those of FIG. 4A and the IC sockets 320, each of which is mounted on the DUT mounting boards 57.

The cables 12 in the present embodiment has connectors (not shown) at both upper and lower ends, wherein the lower end is connected directly with the test head 2 and the upper end is connected with the DUT mounting board 57.

As shown in FIG. 1 to FIG. 3, the structure of the DUT mounting board according to the present invention can be also applied to the DUT mounting board 57, generally called the socket board, of the device interface unit 3 shown in FIG. 4A and FIG. 4B in the same way, and thus it can correspond to the high speed signals.

Figure 5:
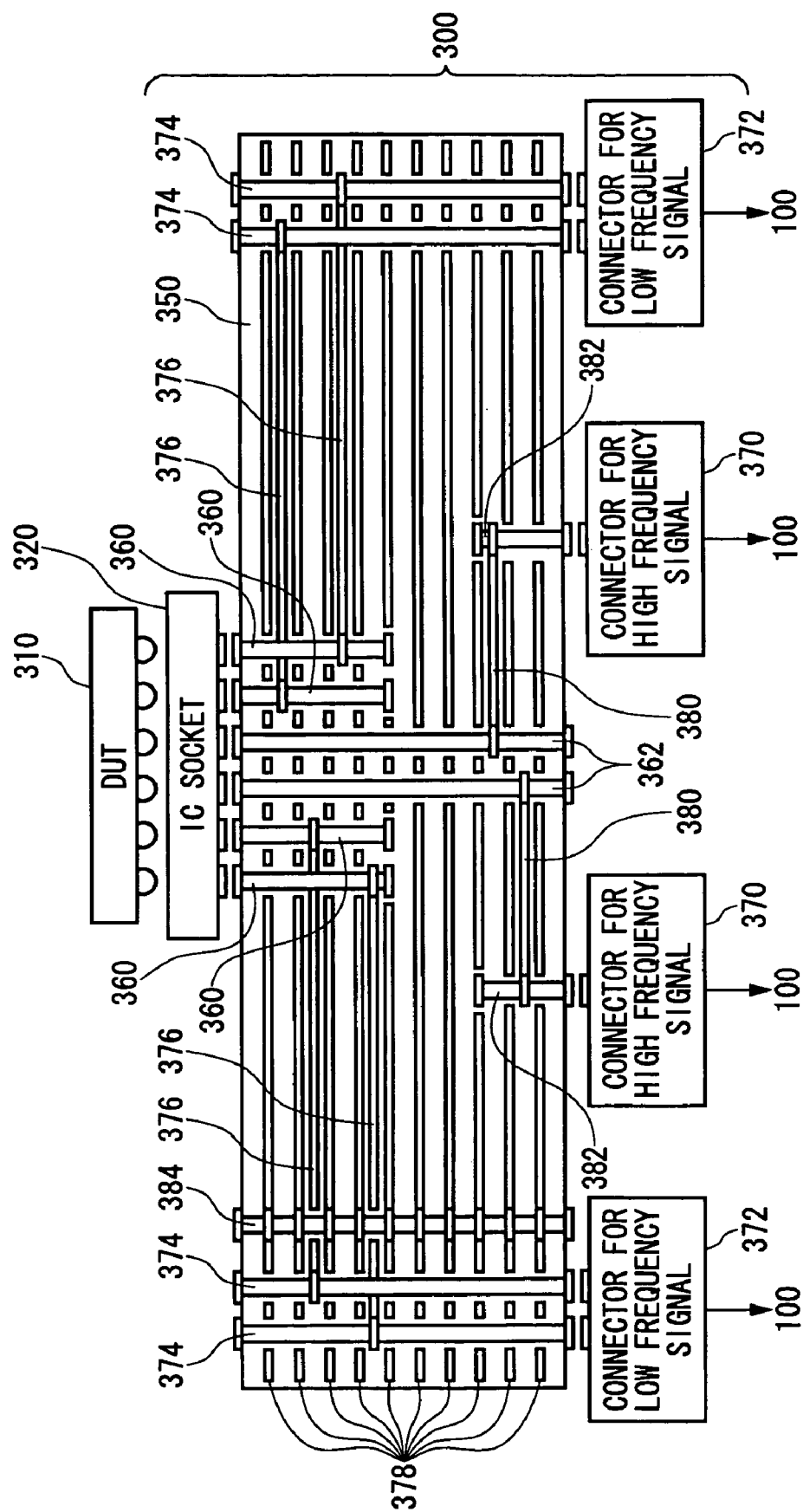
FIG. 5 shows an example of the DUT mounting board, and an example of the detailed configuration of a performance board 300.

FIG. 5 shows an example of the DUT mounting board, and an example of the detailed configuration of the performance board 300. FIG. 5 is a cross-sectional view of the performance board 300. The performance board 300 has the same function and configuration as the DUT mounting boards (50, 55, 56, and 57) described in relation to FIG. 1 to FIG. 4, and allows the electronic device 310 (the device under test 40) and the testing apparatus for testing the electronic device 310 to be electrically connected with each other.

The performance board 300 has an IC socket 320, a socket substrate 350, a plurality of high frequency connectors 370 and a plurality of low frequency connectors 372.

The IC socket 320 holds the electronic device 310, and allows each of pins of the electronic device 310 and each of pins of the performance board 300 to be electrically connected with each other. In addition, the socket substrate 350 holds the IC socket 320 on an upper surface of the socket substrate 350, and is electrically connected with the electronic device 310 via the IC socket 320. In addition, the socket substrate 350 is electrically connected with the testing apparatus 200 (cf. FIG. 10) via the connection unit 100 (cf. FIG. 10).

A plurality of high frequency connectors 370 and a plurality of low frequency connectors 372 are provided at a lower surface of the socket substrate 350, receive the test signals, which should be supplied to the electronic device 310, from the testing apparatus 200 via the connection unit 100, and supply them to the electronic device 310 via the socket substrate 350 and the IC socket 320.

Although it has been describe that one of surfaces of the socket substrate 350 facing the electronic device 310 is the upper surface and a surface facing the testing apparatus 200 is the lower surface in the present embodiment, a surface facing the testing apparatus 200 may be the upper surface and a surface facing the electronic device 310 may be the lower surface in another embodiment.

In addition, the low frequency signal connector 372 is provided at a position farther from the IC socket 320 than the high frequency signal connector 370, and receives signals, of which the frequency is lower than the test signals supplied to the IC socket 320 by the high frequency signal connector 370, from the testing apparatus 200 via the connection unit 100.

The socket substrate 350 is provided with a low frequency signal wiring 376, a high frequency signal wiring 380 and a GND wiring at a plurality of layers in a depth direction. The low frequency signal wiring 376 and the high frequency signal wiring 380 are an example of the internal layer wiring pattern 24 described in regard to FIG. 1 to FIG. 4.

In addition, the socket substrate 350 is provided with the through hole for low frequency 374 across the plurality of layers, the through hole for high frequency 362, the single-sided hole for low frequency 360, the single-sided hole for high frequency 382, and the GND through hole 384.

The through hole for low frequency 374, the through hole for high frequency 362 and the GND through hole 384 are an example of the through hole 23 described in relation to FIG. 1 to FIG. 4, and the single-sided hole for low frequency 360 and the single-sided hole for high frequency 382 are an example of the SVH 51 described in relation to FIG. 1 to FIG 4.

The through hole for low frequency 374 is electrically connected with the low frequency signal connector 372, and is provided to penetrate from the lower surface, at which the low frequency signal connector 372 of the socket substrate 350 is provided, to the upper surface at which the electronic device 310 of the socket substrate 350 is placed. In the present embodiment, the through hole for low frequency 374 is provided closer to the circumference of the socket substrate 350 than the single-sided hole for high frequency 382, the single-sided hole for low frequency 360 and the through-hole for high frequency 362.

In addition, the single-sided hole for low frequency 360, which is the SVH 51 described above, is electrically connected to the low frequency signal pin of the electronic device 310, and is formed from the upper surface of the socket substrate 350 to an intermediate layer position not reaching the lower surface of the socket substrate 350. In the present embodiment, the single-sided hole for low frequency 360 is provided closer to the circumference of the socket substrate 350 than the through hole for high frequency 362.

And, the low frequency signal wiring 376 is formed at one of plurality of layers of the socket substrate 350, allows the through hole for low frequency 374 and the single-sided hole for low frequency 360 to be electrically connected, and transfers the test signals of low frequency. In the socket substrate 350, the GND wiring 378 is formed at a plurality of layers, and the low frequency signal wiring 376 is formed between any of the GND wirings 378.

By this configuration, the socket substrate 350 can supply the test signals of low frequency to the electronic device 310. In addition, since the SVH is used as the single-sided hole for low frequency 360 in order to be electrically connected with the IC socket 320, it is possible to reduce the area of the stub part, which does not contribute to transferring the test signals, so that it is possible to transfer the test signals with high accuracy.

The single-sided hole for high frequency 382, which is the SVH 51 described above, is electrically connected with the high frequency signal connector 370, and is extended from the lower surface, at which the high frequency signal connector 370 of the socket substrate 350 is provided, to an intermediate layer position not reaching the lower surface of the socket substrate 350.

In addition, the through hole for high frequency 362 is electrically connected with the high frequency signal pin of the electronic device 310, and is formed to penetrate from the upper surface of the socket substrate 350 to the lower surface of the socket substrate 350. And, the high frequency signal wiring 380 is formed to be closer to the lower surface of the socket substrate 350 than a layer, at which the low frequency signal wiring 376 is formed, of the plurality of layers of the socket substrate 350, thereby allowing the single-sided hole for high frequency 382 and the through hole for high frequency 362 to be electrically connected with each other, and transferring the test signals of high frequency. The single-sided hole for high frequency 382 is not interrupted by the low frequency signal wiring 376 on its upper layer, and further, the single-sided hole for low frequency 360 is not interrupted by the high frequency signal wiring 380 on its lower layer, and therefore it is possible to obtain pattern wiring with high density.

By this configuration, it is possible to supply the test signals of high frequency to the electronic device 310. In addition, since the SVH is used as the single-sided hole for high frequency 382, it is possible to reduce the area of the stub part, which does not contribute to transferring the test signals, which makes it possible to transfer the test signals with high accuracy. Further, by providing the single-sided hole for high frequency 382 more inwardly than the through hole for low frequency 374, it is possible to shorten the transfer route length of the test signals of high frequency and to transfer the test signals with high accuracy.

In addition, the GND wiring 378, which is formed at the plurality of layers and is a ground surface having an entire solid surface formed at almost all surfaces of the GND layer, is electrically connected with the GND through hole 384, and is connected with the ground voltage via the GND through hole 384. In addition, although FIG. 5 shows only one GND through hole 384, a plurality of GND through holes 384 is provided with a required pitch over all surfaces of the socket substrate. In addition, it is provided near the single-sided hole or the through hole such as the single-sided hole for high frequency 382.

Figure 6A:
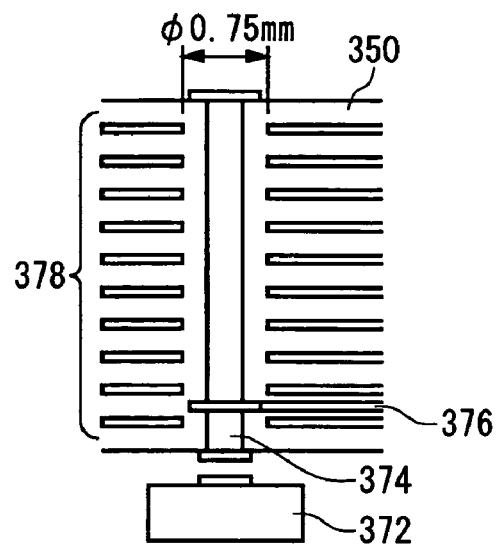
FIGS. 6A–6C show an example of enlarged views of a section of a socket substrate 350.
Figure 6B:
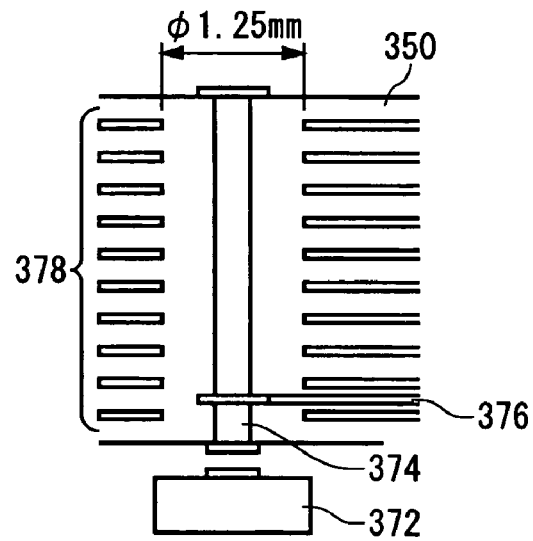
Figure 6C:
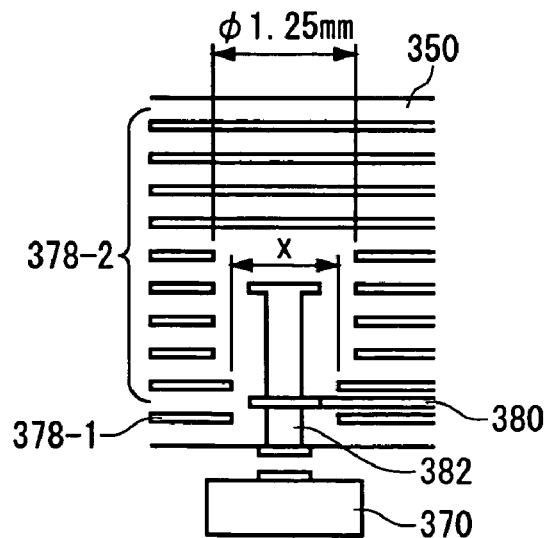

FIGS. 6A—6C show an example of an enlarged view of a section of the socket substrate 350. As described above, the socket substrate 350 is provided with the GND wiring 378 at a plurality of layers in the depth direction, and the signal wiring of the low frequency signal wiring 376 or the high frequency signal wiring 380 is designed to have a characteristic impedance of for example 50 Ω when formed at the layer between the GND wirings 378.

Moreover, in the GND layer of the socket substrate 350, in the area at which the through hole for low frequency 374, the single-sided hole for high frequency 382, the single-sided hole for low frequency 360 and the through hole for high frequency 362 are formed, predetermined patterns need to be formed at each of the GND layers between the through hole or the single-sided hole and the GND wiring 378. That is, it is required to form the through hole or the single-sided hole and the GND wiring 378 to have a predetermined interval in a horizontal direction of each of the GND layers. In the present embodiment, the through hole or the single-sided hole and the GND wiring 378 are formed to be about 0.3 mm ~0.35 mm.

FIG. 6A shows an example of an enlarged view near the through hole for low frequency 374. In the present embodiment, the GND wiring 378 in regard to each of the GND layers is formed in order not to exist in a circular area, which is a circle concentric with the through hole for low frequency 374 and its diameter is larger than the through hole for low frequency 374. In the present embodiment, the GND wiring 378 in regard to each of the GND layers is formed in order not to exist in a circular area having the diameter of 0.75 mm, which is a circle concentric with the through hole for low frequency 374.

FIG. 6B shows another example of an enlarged view near the through hole for low frequency 374. In the present embodiment, the GND wiring 378 in regard to each of the GND layers is formed in order not to exist in a circular area, of which the diameter is larger than the example described in regard to FIG. 6A. In the present embodiment, the GND wiring 378 is formed in order not to exist in a circular area having the diameter of 1.25 mm, which is a circle concentric with the through hole for low frequency 374.

By these configurations, the distance between the through hole for low frequency 374 and the GND wiring 378 can be broaden, consequently, the capacitance that occurs between the through hole for low frequency 374 and the GND wiring 378 can be reduced, and thus it is possible to transfer the test signals with high accuracy. In addition, it is preferable to have the same configuration as FIG. 6B in regard to the vicinity of the through hole for high frequency 362.

FIG. 6C shows an example of an enlarged view near the single-sided hole for high frequency 382. As shown in FIG. 6C, the single-sided hole of the single-sided hole for high frequency 382 or the single-sided hole for low frequency 360 is formed in order not to penetrate the socket substrate 350. Due to this, if the single-sided hole extends to the upper or lower surface of the socket substrate 350, the GND wiring 378 is formed at an area where the single-sided hole is formed.

In addition, as described above, since the socket substrate 350 is formed by bonding a plurality of substrates where the single-sided hole is formed as the penetrating hole, each of the lengths of the single-sided holes (SVH) in a depth direction are constant. Due to this, if electrically connected with the signal wiring in regard to each of the layers having different depths, the stub part that does not contribute to transferring the test signals occurs even though the SVH is used.

Accordingly, a plurality of GND wirings 378 is divided into the upper layer GND wiring 378-2, which is formed closer to a layer of the upper surface of the socket substrate 350 than the high frequency signal wiring 380, and the lower layer GND wiring 378-1, which is formed closer to a layer of the lower surface of the socket substrate 350 than the high frequency signal wiring 380.

As shown in FIG. 6C, by allowing the distance in a horizontal direction between at least a part of a plurality of upper layer GND wirings 378-2 and the single-sided hole for high frequency 382 to be larger than the distance in a horizontal direction between the lower layer GND wiring 378-1 and the single-sided hole for high frequency 382, it is possible to reduce the capacitance in regard to the stub part. That is, supposing the diameter of a circular shape is x, in which the lower layer GND wiring 378-1 is not formed, in regard to an area, where the single-sided hole for high frequency 382 is formed, of a layer where the lower layer GND wiring 378-1 is designed to be formed, it is preferable that x is smaller than 1.25 mm.

In addition, it is preferable that the distance in a horizontal direction between one of a plurality of the upper layer GND wirings 378-2 nearest to the high frequency signal wiring 380 and the single-sided hole for high frequency 382 is approximately the same as the distance in a horizontal direction between the lower layer GND wiring 378-1 and the single-sided hole for high frequency 382, and is smaller than the distance in a horizontal direction between the other of the upper layer GND wirings 378-2 and the single-sided hole for high frequency 382. By this configuration, it is possible to reduce the influence of the noise in regard to the high frequency signal wiring 380 in addition to reducing the capacitance in regard to the stub part.

FIG. 7 shows an example of the result of measuring reflection components that occur in regard to the example shown in FIGS. 6A, 6B and 6C, respectively. In FIG. 7, the horizontal axis represents the reflection component, and the vertical axis represents the position where the reflection occurs. In addition, (a) in FIG. 7 represents the magnitude of the reflection component in regard to the example shown in FIG. 6A, (b) represents the magnitude of the reflection component in regard to the example shown in FIG. 6B and (c) represents the magnitude of the reflection component in regard to the example shown in FIG. 6C.

As shown in FIG. 7, in regard to the example shown in FIG. 6A, the reflection component of −19.5% occurs against the test signals in the stub part of the single-sided hole. Meanwhile, in regard to the example shown in FIG. 6B, the reflection component of −12.5% occurs against the test signals, it is understood that the reflection component is reduced by broadening the distance between the single-sided hole and the GND wiring 378.

In addition, in regard to the example shown in FIG. 6C, the reflection component of −7.2% occurs against the test signals, it is understood that the reflection component is further reduced by forming the GND wiring 378 as shown in FIG. 6C by using the single-sided hole (SVH) as an alternative to the through hole.

Figure 8:
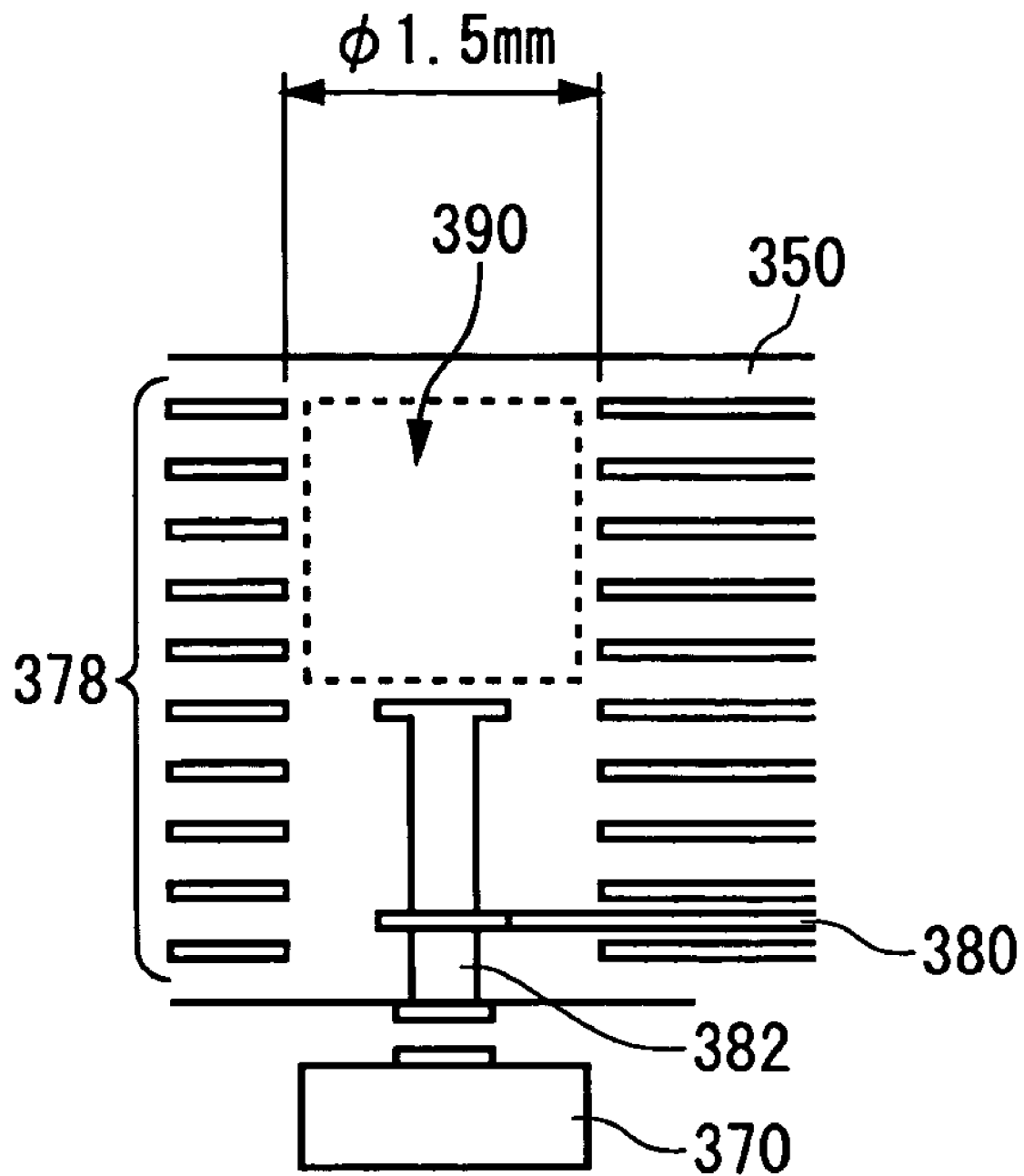
FIG. 8 shows another example of an enlarged view near a single-sided hole for high frequency 382.

FIG. 8 shows another example of an enlarged view near the single-sided hole for high frequency 382. The present embodiment is an example wherein the GND wiring 378 is removed in regard to the area 390. By this configuration, it is possible to transfer the test signals with further high accuracy by reducing the capacitance that occurs between the GND wiring 378 formed over the stub part and the single-sided hole for high frequency 382.

Moreover, in the present embodiment, in regard to each of the GND layers, the diameter of the circular area where the GND wiring 378 is not formed is set to be 1.5 mm. Although it is desirable that the diameter of the circular area is as large as possible while the GND layer adjacent to the high frequency signal wiring 380 is removed, the size is limited because the GND through hole 384 is formed over all surfaces of the socket substrate 350 as described above. That is, it is preferable that the diameter of the circular area, where the GND wiring 378 in regard to each of the GND layers is not formed, is formed as large as possible in a range in order not to overlap by having a predetermined margin to the GND through hole 384 formed over all surfaces of the socket substrate 350.

Figure 9:
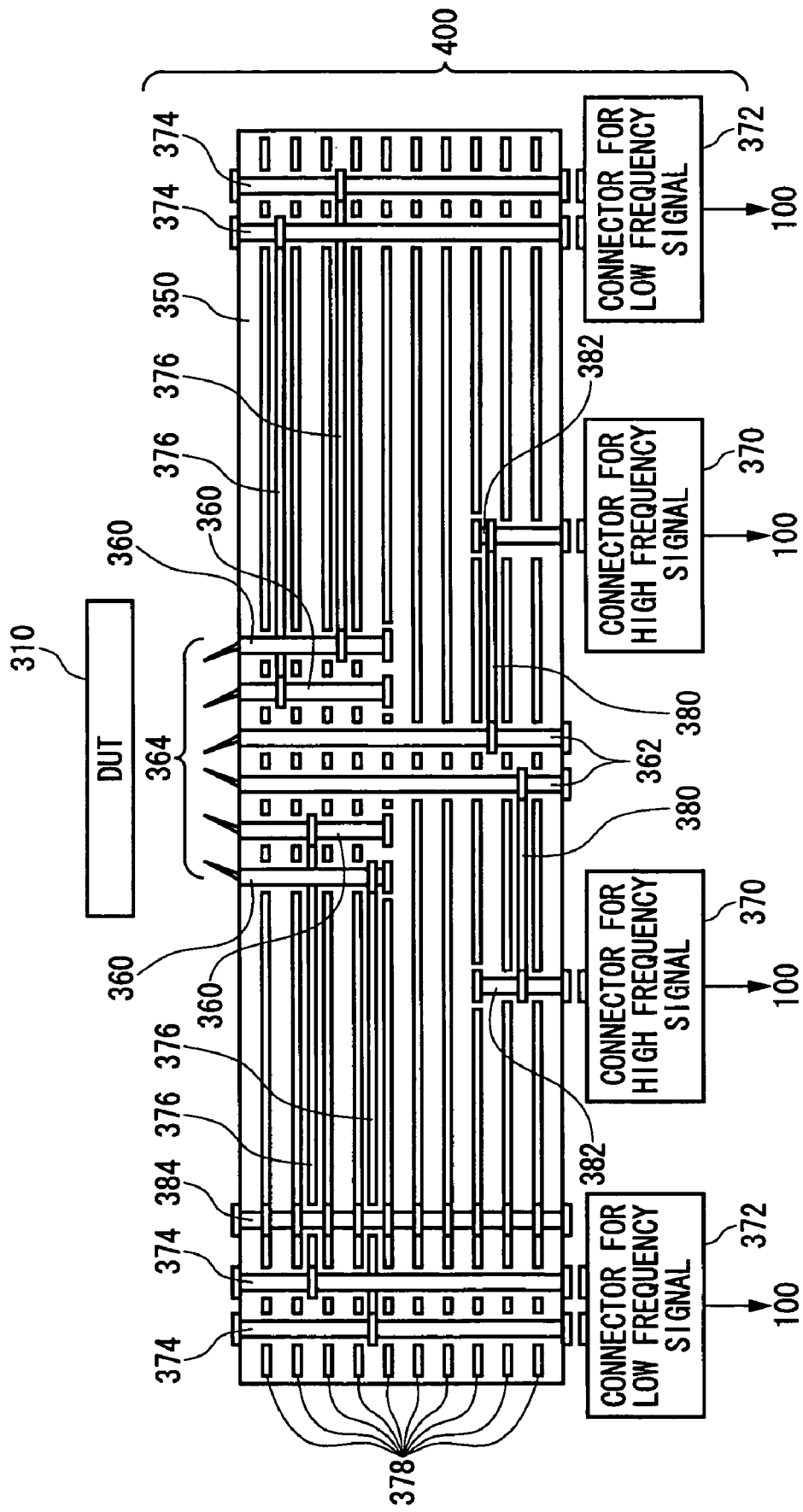
FIG. 9 shows an example of a detailed configuration of a probe card 400 that is an example of the DUT mounting board.

FIG. 9 shows an example of a detailed configuration of a probe card 400 that is an example of the DUT mounting board. FIG. 9 is a cross-sectional view of the probe card 400. In FIG. 5 to FIG. 8, although it is electrically connected with the electronic device 310 by using the performance board 300, it may be electrically connected with the electronic device 310 by using the probe card 400 as an alternative to the performance board 300.

In this case, the probe card 400 has the same function and configuration as those of the performance board 300. In the present embodiment, the probe card 400 has, in regard to the configuration of the performance board 300, a plurality of probe pins 364 electrically connected with the terminals of the electronic device 310 as an alternative to the IC socket 320. In this case, the socket substrate 350 is functioning as a probe substrate for holding the probe pins 364. In addition, when using the probe card 400, the electronic device 310 can be tested in the form of a wafer without a package.

Next, a connection unit for connecting the performance board 300 or the probe card 400 and a testing apparatus body will be described. The connection unit is an example of the motherboard 70 described in regard to FIG. 4.

Figure 10:
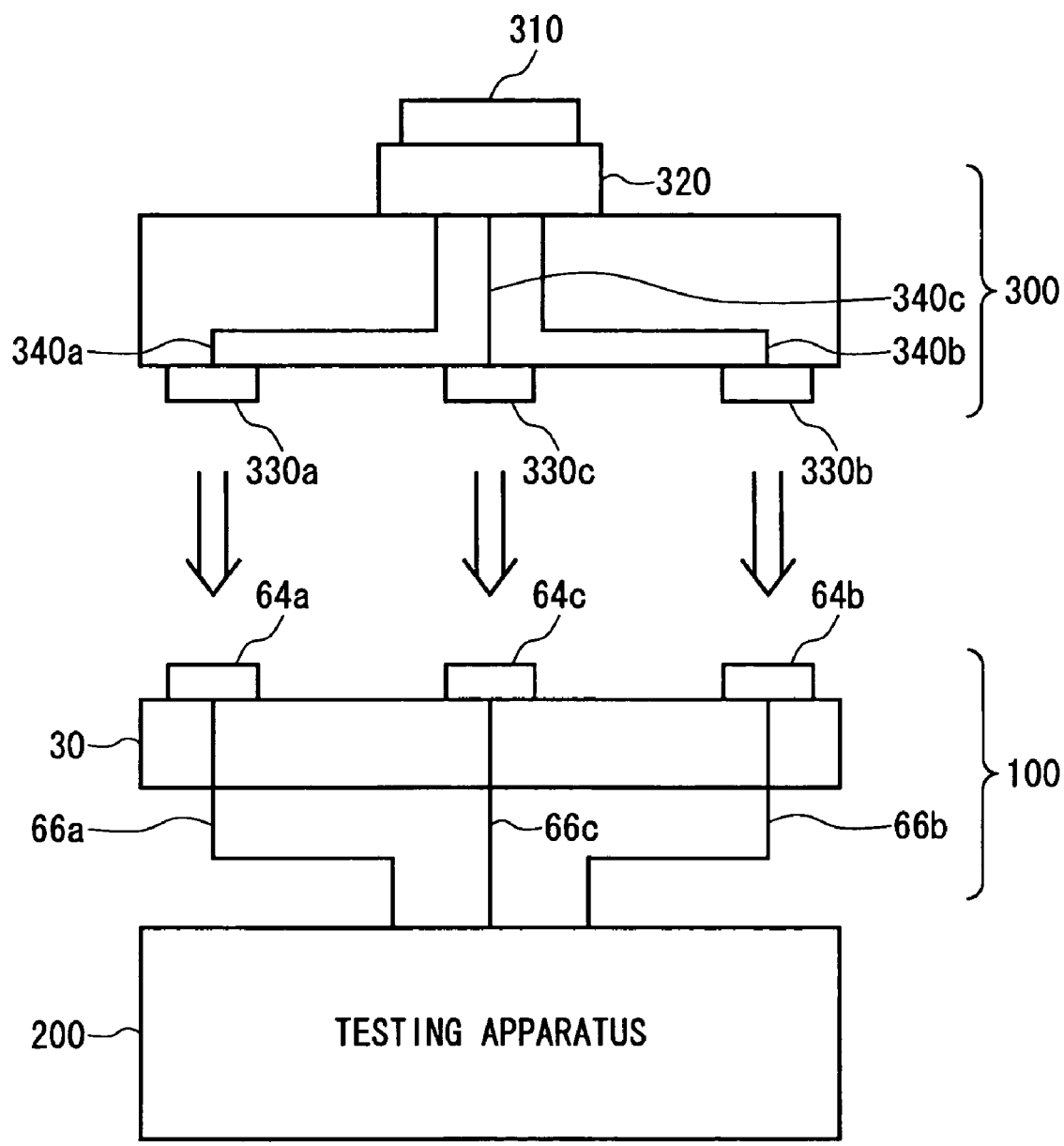
FIG. 10 depicts a test of an electronic device.

FIG. 10 depicts an overall system configuration for testing an electronic device. As described in FIG. 4, the electronic device 310 to be tested is placed on the performance board 300 which is an example of the DUT mounting board. The performance board 300 has the same function and configuration as the performance board 300 described in regard to FIG. 5 to FIG. 8. The testing apparatus 200 generates the test signals for testing the electronic device 310 such as a semiconductor device. In addition, the connection unit 100 connects the testing apparatus 200 and the performance board 300 electrically, and supplies the test signals to the electronic device 310 placed on the performance board 300.

The testing apparatus 200 generates the test signals having a desired pattern corresponding to the electronic device 310, and supplies them to the electronic device 310 via the connection unit 100 and the performance board 300. In addition, the testing apparatus 200 receives the output signals from the electronic device 310 via the connection unit 100 and the performance board 300. The testing apparatus 200 generates the expected signals corresponding to the electronic device 310, compares them with the output signals received and judges the pass/fail of the electronic device 310.

The performance board 300 has a socket substrate 350, an IC socket 320, a plurality of performance-board-side connectors 330 and a plurality of signal wirings 340. The performance board 300 holds the plurality of performance-board-side connectors 330 on a surface facing the connection unit 100, and holds the IC socket 320 on an upper surface opposite to that facing the connection unit 100. The performance-board-side connectors 330 are, for example, the high frequency signal connector 370 and the low frequency signal connector 372 described in regard to FIG. 5.

The IC socket 320 holds the electronic device 310. In addition, the IC socket 320 has terminals electrically connected with each of the pins of the electronic device 310.

The plurality of performance-board-side connectors 330 receives the test signals, which are supposed to be supplied to the electronic device 310, from the testing apparatus 200 via the connection unit 100, and supplies them the IC socket 320 via the signal wiring 340. In addition, it receives the output signals of the electronic device 310 and supplies them to the connection unit 100. Here, the signal wiring 340 corresponds to the high frequency signal wiring 380, the single-sided hole for high frequency 382, the through hole for high frequency 362, the through hole for low frequency 374, the low frequency signal wiring 376 and the single-sided hole for low frequency 360, which have been described in regard to FIG. 5.

In the present embodiment, the performance-board-side connector 330c provided near the IC socket 320 receives the test signals of high frequency among the test signals to be supplied to the electronic device 310, and is functioning as the high frequency signal socket 370 for supplying the test signals to the IC socket 320. In addition, the performance-board-side connectors (330a and 330b), which are provided at positions farther from the IC socket 320 than the performance-board-side connector 330c, receive the signals having the lower frequency than the test signals supplied to the IC socket 320 by the performance-board-side connector 330c from the testing apparatus 200 via the connection unit 100, and are functioning as the low frequency signal connector 372 for supplying the test signals to the IC socket 320.

The positions of these performance-board-side connectors 330 change corresponding to the number of the IC pins of the electronic device 310 and the IC pin arrangement. In addition, the performance-board-side connector 330 for receiving signals of higher frequency is provided to be nearer to the IC socket 320. Therefore, the distance to the IC socket 320 is changed by the electronic device 310. Further, the performance-board-side connectors (330a and 330b) provided at positions far from the IC socket 320 may supply the source voltage of the electronic device 310.

According to the performance board 300 in the present embodiment, since the performance-board-side connector 330 is provided at a position corresponding to the frequency of the received signals, it is possible to supply the signals to the electronic device 310 with good transfer characteristic. The performance board 300 is made with a board wherein the positions of the performance-board-side connectors 330 change corresponding to the number of the IC pins of the electronic device 310 and the IC pin arrangement.

The connection unit 100 has a holding substrate 30, a plurality of connection-unit-side connectors 64 and a plurality of connection cables (66a, 66b and 66c). The holding substrate 30, which is a structural body for fixing a plurality of connection-unit-side connectors 64 at a predetermined position, is provided on a side facing the performance board 300. In addition, the holding substrate 30 holds a plurality of connection-unit-side connectors 64 in regard to a surface facing the performance board 300.

A plurality of connection-unit-side connectors (64a, 64b and 64c) is provided on the holding substrate 30 to be attachable to and detachable from the holding substrate 30 in order to be reused in common, and is connected with the performance-board-side connectors (330a, 330b and 330c) provided in the performance board 300. For example, the plurality of connection-unit-side connectors 64 can be commonly used by changing the holding substrate 30 corresponding to a position of the performance-board-side connector 330 in regard to the performance board 300 to be connected.

A first end of each of the connection cables 66 is fixed to the corresponding connection-unit-side connector 64, and connects the connection-unit-side connector 64 and the testing apparatus 200 electrically. The testing apparatus 200 is connected to a second end of the connection cables 66, supplies the test signals to the connection unit 100 via this connection and receives the output signals outputted by the electronic device 310 from the connection unit 100 via the connection cables 66.

According to the connection unit 100 in the present embodiment, by only changing the cheap holding substrate 30, it is possible to connect a plurality of kinds of performance boards 300 wherein the arrangement of the performance-board-side connector 330 is different. Due to this, it is possible to obtain a great advantage capable of reusing a plurality of connection-unit-side connectors 64 without changing them.

Moreover, although the test signals are supplied to the electronic device 310 by using the performance board 300 in the present embodiment, the test signals may be supplied to the electronic device 310 by using the probe card 400 as described in regard to FIG. 9 in another embodiment.

Figure 11:
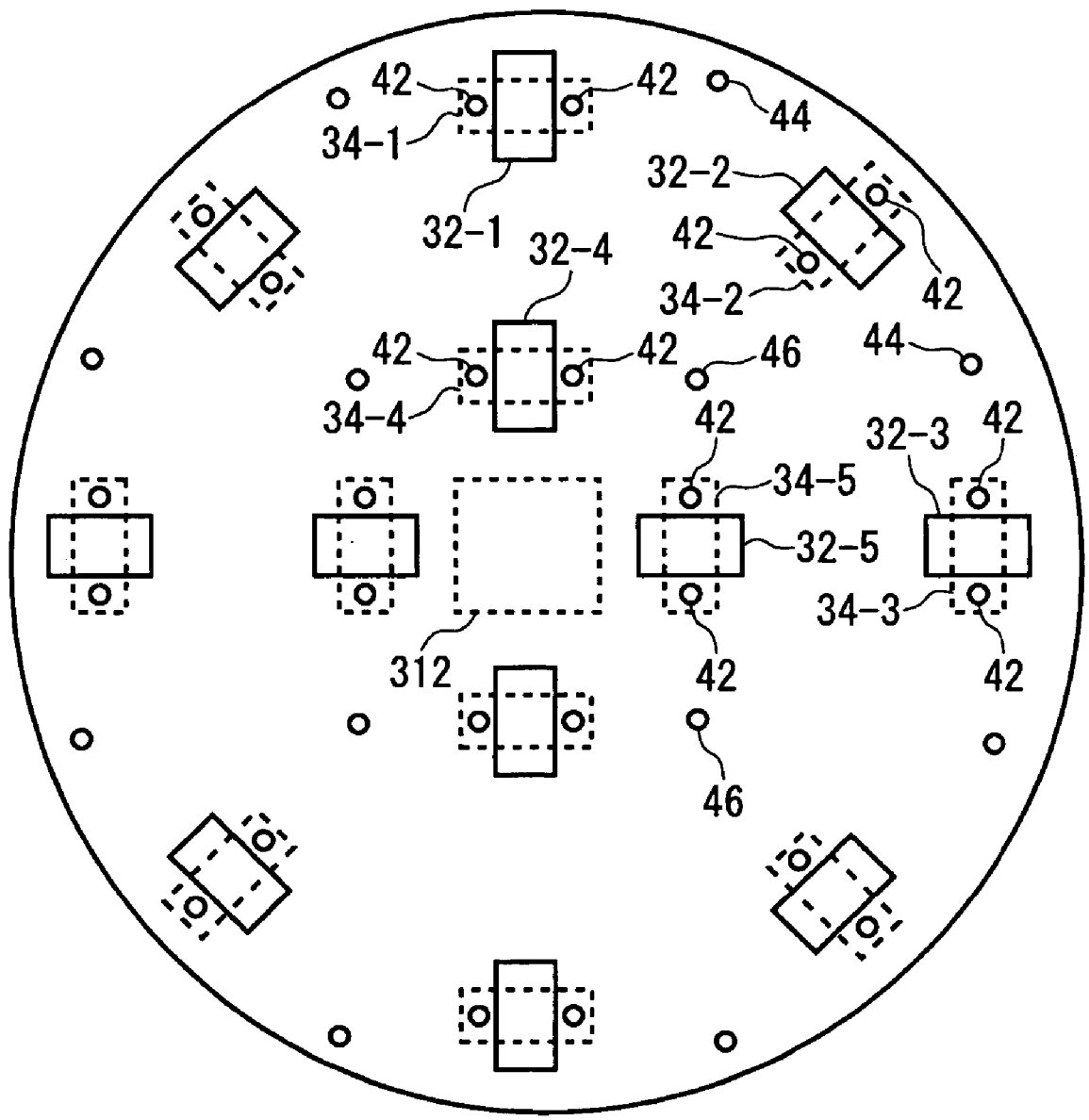
FIG. 11 shows an example of an upper surface of a holding substrate 30.

FIG. 11 shows an example of an upper surface of the holding substrate 30. When the connection unit 100 and the performance board 300 are connected, the electronic device 310 is placed at a placement position 312.

The plurality of connection-unit-side connectors 64 (cf. FIG. 10) is attachable and detachable, and can move to the plurality of arrangement positions 34. For example, a plurality of arrangement positions 34 is provided on the holding substrate 30 in order to change the mutual distance in regard to the holding substrate 30 of a plurality of connection-unit-side connectors 64 as shown in FIG. 11. In addition, as shown in FIG. 11, a plurality of arrangement positions 34 is provided on the holding substrate 30 in order to change the distance of a plurality of connection-unit-side connectors 64 to the placement position 312 of the IC socket 320. In addition, if a probe card is used as an alternative to the performance board 300, the placement position 312 of the IC socket 320 becomes the mounting position of the probe pin.

In addition, the holding substrate 30 has a positioning member 42 for holding the connection-unit-side connector 64 at each of the arrangement positions 34. Due to this, the arrangement position 34 is used to change the connection-unit-side connector 64.

In addition, the holding substrate 30 has a penetrating hole 32, of which the size is fit for passing the connection-unit-side connector 64, at each of the arrangement positions 34. The penetrating hole 32 is provided across a surface facing the testing apparatus 200 from a surface facing the performance board 300 of the holding substrate 30. If the mounting position of the connection-unit-side connector 64 is changed, the connection-unit-side connector 64 is taken out through the testing apparatus 200 via the penetrating hole 32, and is mounted through the performance board 300 via the penetrating hole 32 corresponding to the arrangement position 34 to which it is supposed to be moved. Due to this, even though the connection cable 66 (cf. FIG. 10) is fixed to the connection-unit-side connector 64, it is possible to move the connection-unit-side connector 64 to a desired position. Therefore, there is a great advantage to be able to reuse the connection-unit-side connectors 64.

In addition, the penetrating holes 32 may be provided across a plurality of arrangement positions 34. That is, the opening parts of the penetrating holes 32 may be provided across a plurality of arrangement positions 34. For example, the opening part of the penetrating hole 32-1 and the opening part of the penetrating hole 32-4 shown in FIG. 11 may be connected to be one penetrating hole. In this case, if the connection-unit-side connector 64 is moved from the arrangement position 34-1 to the arrangement position 34-4, it is possible to change the position of the connection-unit-side connector 64 easily because the connection cables 66 can pass through the penetrating hole from the arrangement position 34-1 to the arrangement position 34-4.

And, as shown in FIG. 11, it is preferable that a plurality of arrangement positions 34 is provided so as to change the position of the connection-unit-side connector 64 in both radial and circumferential directions taking the placement position 312 of the IC socket 320 as a center.

Moreover, in the present embodiment, the cross-sections of the IC socket 320 and the connection-unit-side connector 64 in regard to a surface approximately parallel to the holding substrate 30 are rectangular. In the radial direction, if the connection-unit-side connector is held at the arrangement position 34 nearest to the placement position 312 of the IC socket 320, it is preferable that the holding substrate 30 holds the connection-unit-side connector 64 in order that the long side of the section of the connection-unit-side connector 64 faces the nearest side of the section of the IC socket 320. For example, the positioning member 42 provided at the arrangement position 34-4 holds the connection-unit-side connector 64 in order that the long side of the connection-unit-side connector 64 is approximately parallel to the nearest side of the section of the IC socket 320. A plurality of terminals are provided in the connection-unit-side connector 64 along the long side direction, thus when the connection-unit-side connector 64 is provided near the IC socket 320 to which the signals of high frequency are supposed to be supplied, it is possible to set the distance between each of the terminals and the pins of the electronic device 310 to be approximately the same, and thus it is possible to supply the signals to the electronic device 310 with good transfer characteristics.

In addition, the holding substrate 30 has a small diameter performance board positioning member 46 and a large diameter performance board positioning member 44. For example, the small diameter performance board positioning member 46 and the large diameter performance board positioning member 44 may be a plurality of protrusions which are provided on a surface of the holding substrate 30 facing the performance board 300 for fitting with the performance board 300.

The small diameter performance board positioning member 46 sets the position to hold the performance board 300 of which the diameter is less than a predetermined size. In addition, the large diameter performance board positioning member 44 is provided at a position, on the holding substrate 30, farther from the placement position 312 of the IC socket 320 than the small diameter performance board positioning member 46, and sets the position to hold the performance board 300 of which the diameter is more than a predetermined size. According to the connection unit 100 in regard to the present embodiment, it is possible to connect a plurality of kinds of performance boards 300 having different diameters with high accuracy.

Figure 12:
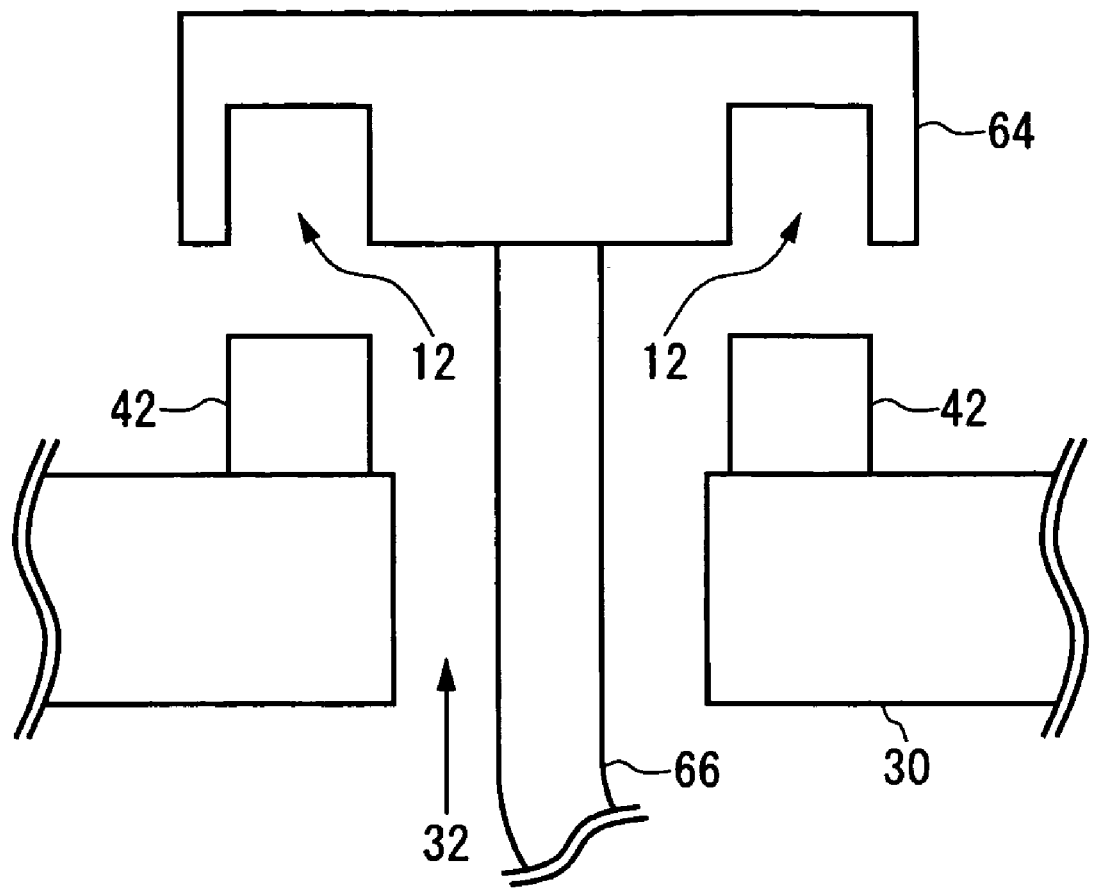
FIG. 12 shows an example of cross-sectional views of a holding substrate 30 and a connection-unit-side connector 64.

FIG. 12 shows an example of cross-sectional views of the holding substrate 30 and the connection-unit-side connector 64. As described above in regard to FIG. 11, the holding substrate 30 has the positioning member 42 on a surface to hold the connection-unit-side connector 64. In the present embodiment, the positioning member 42 is a protrusion which extends in a direction to the connection-unit-side connector 64.

The connection-unit-side connector 64 has a groove 12 for being engaged with the positioning member 42 on a surface facing the holding substrate 30. By engaging the positioning member 42 and the groove 12 of the connection-unit-side connector 64, it is possible to hold the connection-unit-side connector 64 on the holding substrate 30. In addition, the positioning member 42 may be a groove in shape, while the connection-unit-side connector 64 may have a protrusion to engage with the positioning member 42.

Figure 13:
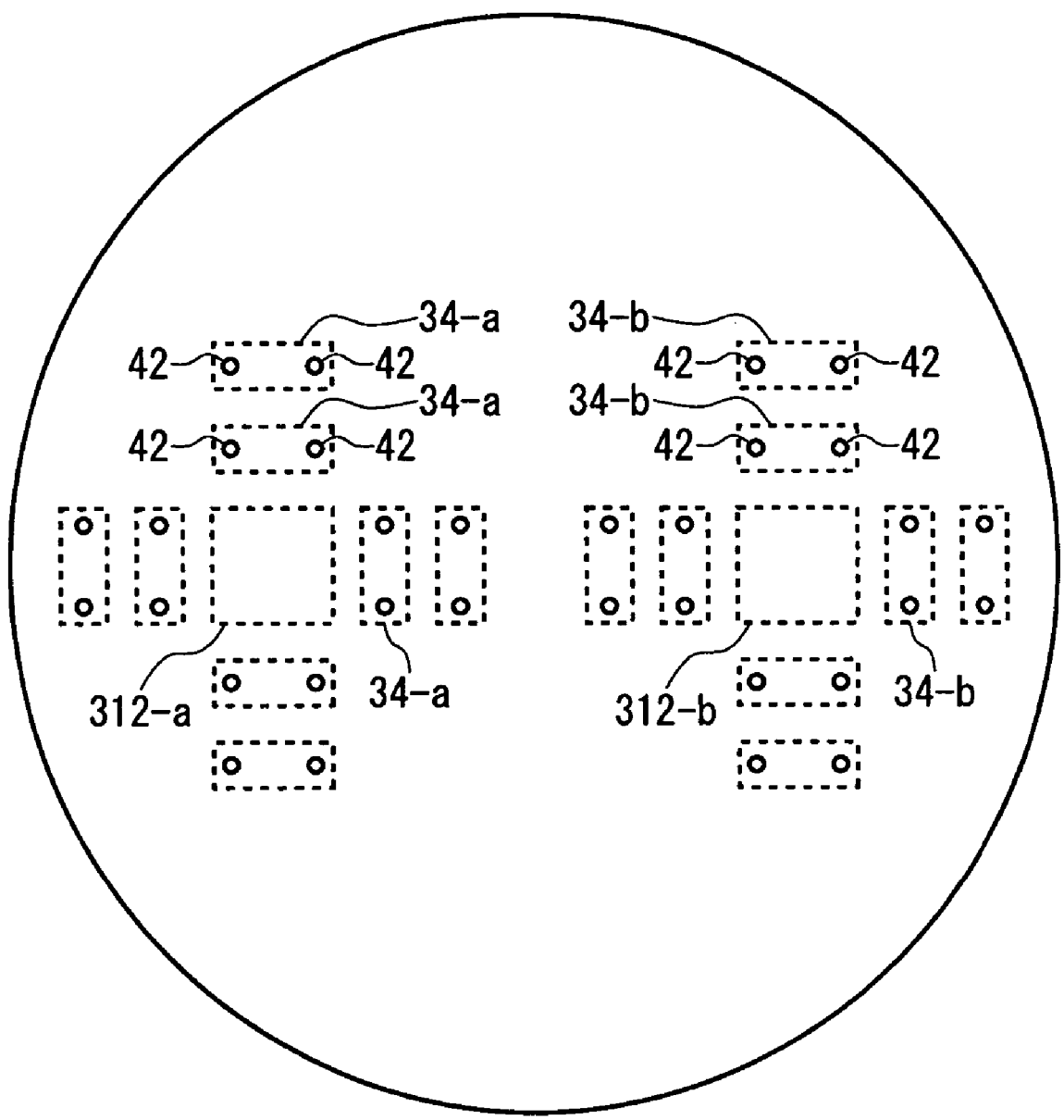
FIG. 13 shows another example of the upper surface of a holding substrate 30.

FIG. 13 shows another example of the upper surface of the holding substrate 30. In the present embodiment, two IC sockets 320 are placed on the performance board 300. The connection unit 100 has a plurality of connection-unit-side connectors 64 provided corresponding to the plurality of IC sockets 320.

The holding substrate 30 holds the corresponding connection-unit-side connector 64 in order to change the position on the holding substrate 30 corresponding to the placement positions 312 of each of the IC sockets 320. That is, the holding substrate 30 has the function and configuration described in regard to FIG. 11 for each of the IC sockets 320. For example, by passing the connection-unit-side connector 64 through a penetrating hole not shown, it is possible to move the connection-unit-side connector 64 to a desired position.

Although the present invention has been described by way of exemplary embodiments, it should be understood that those skilled in the art might make many changes and substitutions without departing from the spirit and the scope of the present invention which is defined only by the appended claims.

As obvious from the description above, according to the DUT mounting board in relation to the present invention, it is possible to decrease the stub capacitance of the through hole part, and thus it is possible to obtain the DUT mounting board suitable for high speed signals.

In addition, since the device interface unit of the testing apparatus has such DUT mounting board, it is possible to obtain good waveform quality in regard to high speed signals, and to perform the test with high speed.

In addition, according to the connection unit in relation to the present invention, it is possible to supply the signals to the electronic device with good transfer characteristic by connecting a plurality of kinds of performance boards or probe cards. Due to this, it is possible to test the electronic device with high accuracy.

What is claimed is:

1. A connection unit for electrically connecting a DUT mounting board, on which an IC socket is mounted, with a testing apparatus for testing an electronic device inserted into said IC socket, said connection unit comprising:
    a holding substrate provided to face said DUT mounting board; and
    a connection-unit-side connector, which is provided on said holding substrate to be able to change a position of said connection-unit-side connector on said holding substrate, for connecting to a performance-board-side connector which said DUT mounting board comprises;
    wherein said holding substrate holds said connection-unit-side connector to be able to change said position in either a radial direction or an axial direction, in response to a position of said IC socket, where said connection unit and said DUT mounting board are connected, as a center; and
    wherein cross sections of said IC socket and said connection-unit-side connector are rectangular respectively at a surface substantially parallel to said holding substrate, and said holding substrate holds said connection-unit-side connector so that a longer side of said cross section of said connection-unit-side connector faces a nearest side of said cross section of said IC socket, in case said connection-unit-side connector is positioned most closely to said IC socket, with regard to a direction of diameter.

2. The connection unit as claimed in claim 1, wherein said holding substrate comprises, in case a position of said performance-board-side connector varies according to kinds of said DUT mounting board, a means for moving said connection-unit-side connector to a position corresponding to said varied position of said performance-board-side connector.

3. The connection unit as claimed in claim 1 or 2, wherein said connection-unit-side connector is detachable from said holding substrate, so that said connection-unit-side connector detached from said holding substrate may be re-attached to other holding substrate on which a performance-board-side connector is provided in a different position.

4. The connection unit as claimed in claim 1, wherein said connection-unit-side connectors are plural, and distances between said plurality of connection-unit-side connectors can be changed on said holding substrate.

5. The connection unit as claimed in claim 1 or 2, wherein said connection-unit-side connector is provided in order that said distance can be changed, with regard to said position of said IC socket where said connection unit and said DUT mounting board are connected.

6. The connection unit as claimed in claim 1 or 2, further comprising a connection cable, of which an end is fixed to said connection-unit-side connector, for electrically connecting said connection-unit-side connector and said testing apparatus,
    wherein said holding substrate has a penetrating hole, of which a diameter admits said connection-unit-side connector, at a position to hold said connection-unit-side connector.

7. The connection unit as claimed in claim 1 or 2, further comprising a connection cable, of which an end is fixed to said connection-unit-side connector, for electrically connecting said connection-unit-side connector and said testing apparatus,
    wherein said holding substrate has a penetrating hole, through which said connection cable passes, between a plurality of positions to be able to change said connection-unit-side connector.

8. The connection unit as claimed in claim 1 or 2, wherein said holding substrate comprises a plurality of connector positioning members, respectively provided at predetermined positions on said holding substrate, for specifying positions where said connection-unit-side connector may be changed.

9. The connection unit as claimed in claim 8, wherein said connection-unit-side connector comprises either a groove or a protrusion, one of which is inserted into one another, each of said plurality of connector positioning members comprises corresponding one of groove or protrusion, and said holding substrate holds said connection-unit-side connector by engaging said groove or protrusion of said connection-unit-side connector with said groove or protrusion of said connector positioning member.

10. The connection unit as claimed in claim 1, wherein a plurality of IC sockets are placed on said DUT mounting board, and said connection unit comprises a plurality of connection-unit-side connectors corresponding to said plurality of said IC sockets, wherein said holding substrate holds each of said plurality of connection-unit-side connectors so that a position of said connection-unit-side connector may be changed corresponding to said plurality of said IC sockets.

11. A connection unit for electrically connecting a DUT mounting board, on which an IC socket is mounted, with a testing apparatus for testing an electronic device inserted into said IC socket, said connection unit comprising:

a holding substrate provided to face said DUT mounting board;

a connection-unit-side connector, which is provided on said holding substrate to be able to change a position of said connection-unit-side connector on said holding substrate, for connecting to a performance-board-side connector which said DUT mounting board comprises;

a small diameter performance board positioning member, provided on said holding substrate, for positioning a DUT mounting board of which a diameter is smaller than a predetermined diameter; and a large diameter performance board positioning member, provided at a position farther from said IC socket than a position of said small diameter performance board positioning member on said holding substrate, for positioning a DUT mounting board of which a diameter is larger than a predetermined diameter.

12. The connection unit as claimed in claim 11, wherein said holding substrate comprises, in case a position of said performance-board-side connector varies according to kinds of said DUT mounting board, a means for moving said connection-unit-side connector to a position corresponding to said varied position of said performance-board-side connector.

13. The connection unit as claimed in claim 11 or 12, wherein said connection-unit-side connector is detachable from said holding substrate, so that said connection-unit-side connector detached from said holding substrate may be re-attached to other holding substrate on which a performance-board-side connector is provided in a different position.

14. The connection unit as claimed in claim 11, wherein said connection-unit-side connectors are plural, and distances between said plurality of connection-unit-side connectors can be changed on said holding substrate.

15. The connection unit as claimed in claim 11 or 12, wherein said connection-unit-side connector is provided in order that said distance can be changed, with regard to said position of said IC socket where said connection unit and said DUT mounting board are connected.

16. The connection unit as claimed in claim 11 or 12, further comprising a connection cable, of which an end is fixed to said connection-unit-side connector, for electrically connecting said connection-unit-side connector and said testing apparatus, wherein said holding substrate has a penetrating hole, of which a diameter admits said connection-unit-side connector, at a position to hold said connection-unit-side connector.

17. The connection unit as claimed in claim 11 or 12, further comprising a connection cable, of which an end is fixed to said connection-unit-side connector, for electrically connecting said connection-unit-side connector and said testing apparatus, wherein said holding substrate has a penetrating hole, through which said connection cable passes, between a plurality of positions to be able to change said connection-unit-side connector.

18. The connection unit as claimed in claim 11 or 12, wherein said holding substrate holds said connection-unit-side connector to be able to change said position in either a radial direction or an axial direction, taking a position of said IC socket, where said connection unit and said DUT mounting board are connected, as a center.

19. The connection unit as claimed in claim 18, wherein cross sections of said IC socket and said connection-unit-side connector are rectangular respectively at a surface substantially parallel to said holding substrate, and said holding substrate holds said connection-unit-side connector so that a longer side of said cross section of said connection-unit-side connector faces a nearest side of said cross section of said IC socket, in case said connection-unit-side connector is positioned most closely to said IC socket, with regard to a direction of diameter.

20. The connection unit as claimed in claim 11 or 12, wherein said holding substrate comprises a plurality of connector positioning members, respectively provided at predetermined positions on said holding substrate, for specifying positions where said connection-unit-side connector may be changed.

21. The connection unit as claimed in claim 20, wherein said connection-unit-side connector comprises either a groove or a protrusion, one of which is inserted into one another, each of said plurality of connector positioning members comprises corresponding one of groove or protrusion, and said holding substrate holds said connection-unit-side connector by engaging said groove or protrusion of said connection-unit-side connector with said groove or protrusion of said connector positioning member.

22. The connection unit as claimed in claim 11, wherein a plurality of IC sockets are placed on said DUT mounting board, and said connection unit comprises a plurality of connection-unit-side connectors corresponding to said plurality of said IC sockets, wherein said holding substrate holds each of said plurality of connection-unit-side connectors so that a position of said connection-unit-side connector may be changed corresponding to said plurality of said IC sockets.

* * * * *